United States Patent [19]
Jones et al.

[11] Patent Number: 5,688,158
[45] Date of Patent: Nov. 18, 1997

[54] PLANARIZING PROCESS FOR FIELD EMITTER DISPLAYS AND OTHER ELECTRON SOURCE APPLICATIONS

[75] Inventors: Gary W. Jones, Poughkeepsie; Steven M. Zimmerman, Pleasant Valley; Susan K. Schwartz Jones; Michael J. Costa, both of Poughkeepsie; Jeffrey A. Silvernail, Kingston, all of N.Y.

[73] Assignee: Fed Corporation, Hopewell Junction, N.Y.

[21] Appl. No.: 519,121

[22] Filed: Aug. 24, 1995

[51] Int. Cl.$^6$ ........................................................ H01J 9/02
[52] U.S. Cl. ........................................................ 445/50
[58] Field of Search ........................ 445/24, 50; 313/309, 313/336

[56] References Cited

U.S. PATENT DOCUMENTS

| | | |
|---|---|---|
| 2,926,286 | 2/1960 | Skellett . |
| 3,665,241 | 5/1972 | Spindt et al. . |
| 3,753,022 | 8/1973 | Fraser, Jr. . |
| 3,921,022 | 11/1975 | Levine . |
| 3,935,500 | 1/1976 | Oess et al. . |
| 3,970,887 | 7/1976 | Smith et al. . |
| 3,982,147 | 9/1976 | Redman . |
| 3,998,678 | 12/1976 | Fukase et al. . |
| 4,008,412 | 2/1977 | Yuito et al. . |
| 4,095,133 | 6/1978 | Hoeberechts . |
| 4,163,949 | 8/1979 | Shelton . |
| 4,164,680 | 8/1979 | Villalobos . |
| 4,256,532 | 3/1981 | Magdo et al. . |
| 4,277,883 | 7/1981 | Kaplan . |
| 4,307,507 | 12/1981 | Gray et al. . |
| 4,325,000 | 4/1982 | Wolfe et al. . |
| 4,337,115 | 6/1982 | Ikeda et al. . |
| 4,341,980 | 7/1982 | Noguchi et al. . |
| 4,498,952 | 2/1985 | Christensen . |
| 4,513,308 | 4/1985 | Greene et al. . |
| 4,578,614 | 3/1986 | Gray et al. . |
| 4,614,564 | 9/1986 | Sheldon et al. . |
| 4,663,559 | 5/1987 | Christensen . |
| 4,670,090 | 6/1987 | Sheng et al. . |
| 4,683,024 | 7/1987 | Miller et al. . |
| 4,685,996 | 8/1987 | Busta et al. . |
| 4,724,328 | 2/1988 | Lischke . |
| 4,774,433 | 9/1988 | Ikebe et al. . |
| 4,818,914 | 4/1989 | Brodie . |
| 4,824,795 | 4/1989 | Blanchard . |
| 4,853,545 | 8/1989 | Rose . |
| 4,900,981 | 2/1990 | Yamazaki et al. . |

(List continued on next page.)

FOREIGN PATENT DOCUMENTS 58-94741  6/1983  Japan .

OTHER PUBLICATIONS

Warren, John B. "Control of silicon field emitter shape with isotropically etched oxide masks," Inst. Phys. Conf. Ser. No. 99: Section 2, 1989, pp. 37–40.

*Primary Examiner*—Kenneth J. Ramsey
*Attorney, Agent, or Firm*—Collier, Shannon, Rill & Scott, PLLC

[57] ABSTRACT

A planarization method for use during manufacture of a microelectronic field emitter device, comprising applying a glass frit slurry including glass particles in a removable base, and subsequently baking to liquify the frit. The invention relates in another aspect to a method of making a microelectronic field emitter device, comprising the steps of: applying a patterned layer of liftoff profile resist over a substrate to define emitter conductor locations; employing the patterned resist layer to form trenches in the substrate at the emitter conductor locations; depositing emitter conductor metal in the trenches and over the patterned resist layer; removing the patterned resist layer; depositing a current limiter layer over the conductors and substrate areas between trenches; depositing a layer of emitter material; pattern masking and etching the layer of emitter material to form emitter structures; depositing gate dielectric; applying a patterned layer of liftoff profile resist over the gate dielectric; evaporating gate metal; and removing the patterned resist layer to define gate electrodes.

4 Claims, 11 Drawing Sheets

U.S. PATENT DOCUMENTS

| | | |
|---|---|---|
| 4,934,773 | 6/1990 | Becker . |
| 4,964,946 | 10/1990 | Gray et al. . |
| 4,990,766 | 2/1991 | Simms et al. . |
| 5,012,153 | 4/1991 | Atkinson et al. . |
| 5,030,895 | 7/1991 | Gray . |
| 5,053,673 | 10/1991 | Tomil et al. . |
| 5,063,327 | 11/1991 | Brodie et al. . |
| 5,070,282 | 12/1991 | Epszein . |
| 5,129,850 | 7/1992 | Kane et al. . |
| 5,140,219 | 8/1992 | Kane . |
| 5,141,459 | 8/1992 | Zimmerman . |
| 5,141,460 | 8/1992 | Jaskie et al. . |
| 5,142,184 | 8/1992 | Kane . |
| 5,144,191 | 9/1992 | Jones et al. . |
| 5,164,632 | 11/1992 | Yoshida et al. . |
| 5,188,977 | 2/1993 | Stengl et al. . |
| 5,191,217 | 3/1993 | Kane et al. . |
| 5,204,666 | 4/1993 | Aoki et al. . |
| 5,216,324 | 6/1993 | Curtin . |
| 5,227,769 | 7/1993 | Leksell et al. . |
| 5,309,169 | 5/1994 | Lippert . |
| 5,313,137 | 5/1994 | Witty . |
| 5,371,433 | 12/1994 | Horne et al. . |
| 5,374,868 | 12/1994 | Tjaden et al. . |
| 5,384,509 | 1/1995 | Kane et al. . |
| 5,386,175 | 1/1995 | Van Gorkom et al. . |
| 5,406,170 | 4/1995 | Uemura et al. . |
| 5,457,356 | 10/1995 | Parodos . |
| 5,475,280 | 12/1995 | Jones et al. .................... 313/309 |

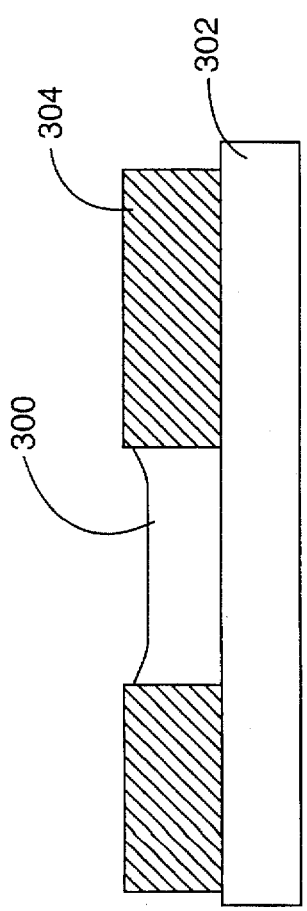
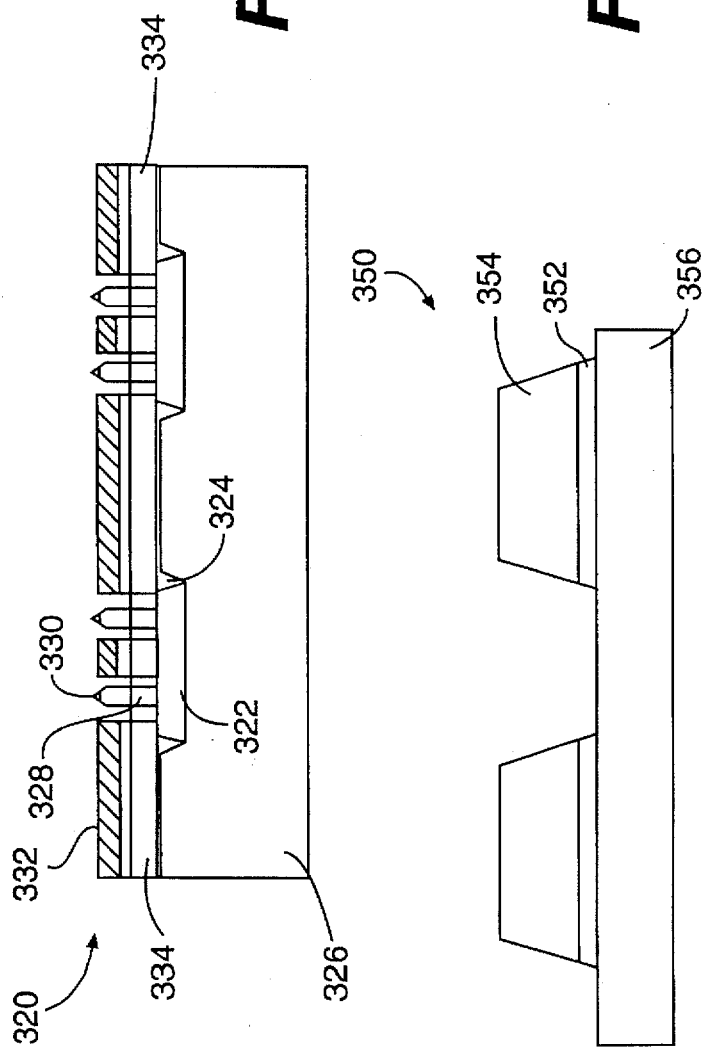
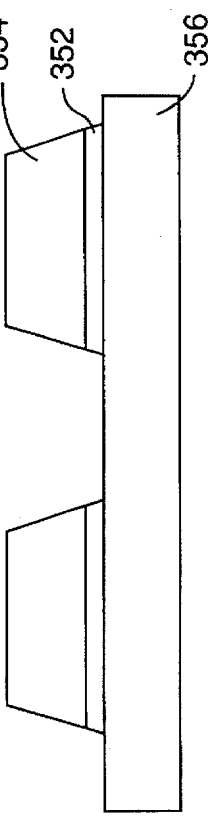

PLANARIZING PROCESS FOR FIELD EMITTER DISPLAYS AND OTHER ELECTRON SOURCE APPLICATIONS

FIELD OF THE INVENTION

The present invention relates to field emission structures and devices, including field emission-based flat panel displays, as well as to methods of manufacture and use of such structures and devices.

BACKGROUND OF THE INVENTION

In the technology of field emission structures and devices, a microelectronic emission element, or a plurality (array) of such elements, is employed to emit a flux of electrons from one or more field emitters. The field emitter, which often is referred to as a "tip", is specifically shaped to facilitate effective emission of electrons, and may for example be conical-, pyramidal-, or ridge-shaped in surface profile.

Field emitter structures have wide potential and actual utility in microelectronics applications, including electron guns, display devices comprising the field emitter structure in combination with photoluminescent material on which the emitted electrons are selectively impinged, and vacuum integrated circuits comprising assemblies of emitter tips coupled with associated control electrodes.

In typical prior art devices, a field emission tip is characteristically arranged in electrical contact with an emitter conductor and in spaced relationship to an extraction electrode, thereby forming an electron emission gap. With a voltage imposed between the emitter tip and extraction electrode, the field emitter tip discharges a flux of electrons. The tip or tip array may be formed on a suitable substrate such as silicon or other semiconductor material, and associated electrodes may be formed on and/or in the substrate by well-known planar techniques to yield practical microelectronic devices.

Two general field emitter types are known in the art, horizontal and vertical, the direction of electron beam emission relative to the substrate determining the orientational type. Horizontal field emitters utilize horizontally arranged emitters and electrodes to generate electron beam emission parallel to the (horizontally aligned) substrate. Correspondingly, vertical field emitters employ vertically arranged emitters and electrodes to generate electron beam emission perpendicular to the substrate.

Examples of horizontal field emitters are disclosed in Lambe U.S. Pat. No. 4,728,851 and Lee et al U.S. Pat. No. 4,827,177. The Lambe and Lee et al structures are formed as a single horizontal layer on a substrate. An improved horizontal field emitter is disclosed in Jones et al U.S. Pat. No. 5,144,191.

Examples of vertical field emitters are disclosed in Levine U.S. Pat. No. 3,921,022; Smith et al U.S. Pat. No. 3,970,887; Fukase et al. U.S. Pat. No. 3,998,678; Yuito et al U.S. Pat. No. 4,008,412; Hoeberechts U.S. Pat. No. 4,095,133; Shelton U.S. Pat. No. 4,163,949; Gray et al. U.S. Pat. No. 4,307,507; Greene et al U.S. Pat. No. 4,513,308; Gray et al U.S. Pat. No. 4,578,614; Christensen U.S. Pat. No. 4,663,559; Brodie U.S. Pat. No. 4,721,885; Baptist et al U.S. Pat. No. 4,835,438; Borel et al U.S. Pat. No. 4,940,916; Gray et al. U.S. Pat. No. 4,964,946; Simms et al. U.S. Pat. No. 4,990,766; and Gray U.S. Pat. No. 5,030,895.

As further examples, Tomii et al U.S. Pat. No. 5,053,673 discloses the fabrication of vertical field emission structures by forming elongate parallel layers of cathode material on a substrate, followed by attachment of a second substrate so that the cathode material layers are sandwiched therebetween in a block matrix. Alternatively, the cathode material layer can be encased in a layer of electrically insulative material sandwiched in such type of block matrix. The block then is sectioned to form elements having exposed cathode material on at least one face thereof. In the embodiment wherein the cathode material is encased in an insulative material, the sliced members may be processed so that the cathode material protrudes above the insulator casing. The exposed cathode material in either embodiment then is shaped into emitter tips (microtip cathodes).

Spindt et al U.S. Pat. No. 3,665,241 discloses vertical field emission cathode/field ionizer structures in which "needle-like" elements such as conical or pyramidal tips are formed on a (typically conductive or semiconductive) substrate. Above this tip array, a foraminous electrode member, such as a screen or mesh, is arranged with its openings vertically aligned with associated tip elements. In one embodiment disclosed in the patent, the needle-like elements comprise a cylindrical lower pedestal section and an upper conical extremity, wherein the pedestal section has a higher resistivity than either the foraminous electrode or the upper conical extremity, and an insulator may be arranged between the conical tip electrodes and the foraminous electrode member. The structures of this patent may be formed by metal deposition through a foraminous member (which may be left in place as a counter-electrode, or replaced with another foraminous member) to yield a regular array of metal points.

Jones et al U.S. Pat. No. 5,371,431 discloses a vertical column emitter structure in which the columns include a conductive top portion and a resistive bottom portion, and upwardly vertically extend from a horizontal substrate. By this arrangement, an emitter tip surface is provided at the upper extremity of the column and the tip is separated from the substrate by the elongate column. An insulating layer is formed on the substrate between the columns. An emitter electrode may be formed at the base of the column and an extraction electrode may be formed adjacent the top of the column.

As described in Jones et al U.S. Pat. No. 5,371,431, the vertical column emitter structure may be fabricated by forming the tips on the face of the substrate, followed by forming trenches in the substrate around the tips to form columns having the tips at their uppermost extremities. Alternatively, the vertical column emitter structure of U.S. Pat. No. 5,371,431 is described as being fabricatable by forming trenches in the substrate to define columns, followed by forming tips on top of the columns. In either method, the trenches may be filled with a dielectric and a conductor layer may be formed on the dielectric to provide extraction electrodes.

Further improvements in vertical field emitter structures and fabrication methods are disclosed in Jones U.S. patent application Ser. No. 029,880, filed Mar. 11, 1993, entitled "Emitter Tip Structure and Field Emission Device Comprising Same, and Method of Making Same,", now abandoned, and in corresponding International Application Number PCT/US94/02669, published on 15 Sep. 1994 as International Publication WO 94/20975.

SUMMARY OF THE INVENTION

By the present invention, a number of structures are provided which enhance the performance and reliability of field emitter devices, particularly field emitter displays. The invention additionally provides methods for fabricating the structures.

More particularly, the invention provides various improved structures and methods for step coverage of the emitter lines, known as planarization, which is important to the performance of field emitter displays.

BRIEF DESCRIPTION OF THE DRAWINGS

FIG. 2 represents a general planarization technique employing a glass frit;

FIG. 3 represents an alternative device structure including self-aligned trenches facilitating planarization;

FIGS. 4 and 5 depict a fill-in planarization process;

DETAILED DESCRIPTION OF THE INVENTION, AND PREFERRED EMBODIMENTS THEREOF

Figure 1:
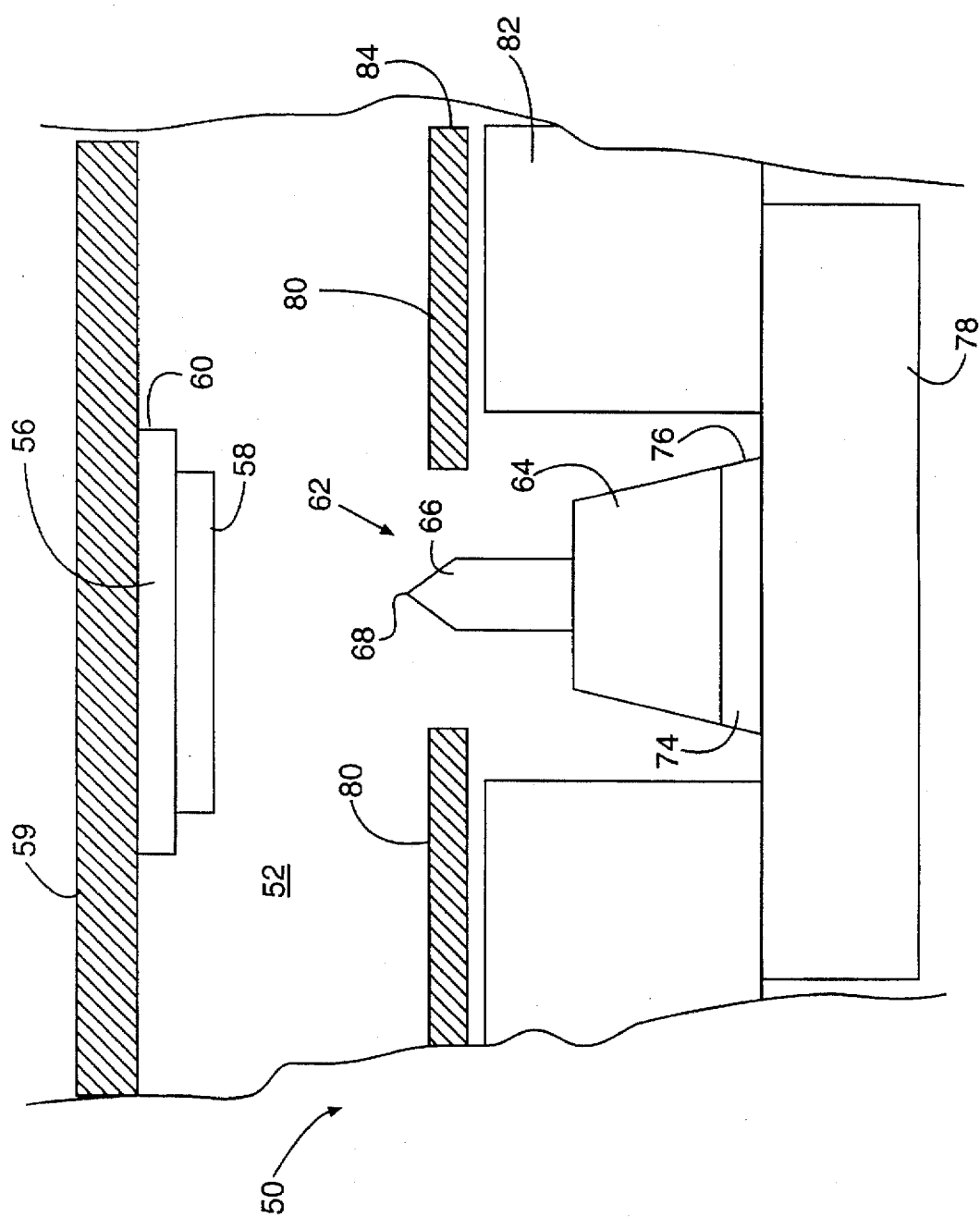
FIG. 1 is a cross-sectional drawing of a flat panel display including a field emitter representing a typical environment for the planarizing structures of the invention.

Referring first to the general representation of FIG. 1, a typical environment in which the planarizing structures of the invention may be employed is a flat panel display device 50, which includes a simplified representation of a vertical "tip" field emitter structure such as is disclosed in the above-identified Jones et al. U.S. Pat. No. 5,371,431. The device 50 has an evacuated space 52, and a transparent panel 54 for viewing. On the underside of the panel 54 is a thin transparent anode electrode 56, supporting electroluminescent material 58. During operation the anode 56 is connected to a suitable positive supply voltage, schematically represented at 60.

A vertical tip emitter 62 comprises a column or pedestal 64 of current limiter material supporting an emitter electrode 66 having an emitter tip 68. Suitable current limiters are disclosed in concurrently-filed U.S. patent application Ser. No. 08/518,745, [Attorney Docket 3131-120] filed in the names of Gary W. Jones, Steven M. Zimmerman, Susan K. Schwartz Jones, Michael J. Costa, and Jeffrey A. Silvernail, and entitled "PEDESTAL EDGE EMITTER AND NON-LINEAR CURRENT LIMITER FOR FIELD EMITTER DISPLAYS AND OTHER ELECTRON SOURCE APPLICATIONS", the entire disclosure of which is hereby expressly incorporated herein by reference.

The pedestal 64 of current limiter material is formed on a lower cathode conductor layer 74, likewise patterned. During operation the conductor 74 is connected to a supply voltage source represented at 76, which is negative with reference to the anode supply 60. The conductor 74 is formed over a suitable substrate 78, such as a glass substrate.

To complete the FIG. 1 flat panel display 50, a gate electrode 80 is fabricated surounding the emitter 62, and separated from the emitter by a gap. The gate electrode 80 is supported on an insulating stack 82, and schematically connected to a gate (G) terminal 84. During operation the gate terminal (G) 84 is appropriately biased to control electron current flow between the emitter 66 and the anode 56, and thus the illumination from the electroluminescent layer 58.

Structures like that of FIG. 1 may be formed in either a point-in-circle pattern, or in a linear knife edge in slot pattern. Point-in-circle patterns are preferred in most display applications.

Step coverage of emitter lines is important to the performance of field emitter displays. As is illustrated in FIG. 2, one general planarization technique in accordance with the invention involves the use of a low temperature glass frit 300 smoothed onto the substrate 302 between emitter conductors 304.

In a glass frit deposition technique, a slurry of small particle material (high content of <10 micron glass particles) with a removable binder (e.g., nitrocellulose, polyvinyl alcohol, or even suspensions of compounds containing glass precursors such as polysiloxane or tetraethylorthosilicate) is employed. The frit slurry is applied across the surface of the display precursor using a squeegee. This material is optimally dispensed on the surface of the display precursor at the point in the process flow where the planarization is required. As an example, this point may be just after formation of the current limiter material structure, or optionally after conductor 304 formation. Multiple deposition passes may be used with subsequently finer or lower viscosity slurries. Low temperature baking (e.g., 150° C./30 min) should be used to dry the surface between depositions. A final bake is used to remove the binder, liquefy the frit, and thus planarize the surface During the baking, some shrinkage occurs, and multiple applications may be used if full planarization is required, although smoothing as is depicted in FIG. 2 is usually adequate. An etch back is preferably used to remove any trace residual glass (RIE such as with CF4+O2 etchant or by a wet oxide etch such as with a buffered oxide etchant).

A variation, applicable when the display device being manufactured is a field emitter array-based display with a transparent substrate such as glass, is to add in a photoactive sensitizer to the slurry. A sensitizer such as ammonium dichromate in polyvinyl alcohol may be used. The slurry may be applied by spin-on using this technique.

The frit slurry is then exposed to high intensity light or UV light through the back side of the substrate. The metal conductors 304 block the light from exposing frit slurry on the top of the conductors 304, while permitting exposure and polymer cross linking between the conductor lines 304. After exposure, the device precursor is developed thereby removing the un-exposed material on top of the conductors 304, but leaving slurry between the conductors 304.

The device precursors are then baked in air to remove the organic material. For example, a slow ramp to 450° C. for one hour, with an intermediate dwell cycle of one hour at 300° C.

This process permits the region between the conductors 304 to be filled with glass while leaving the top of the conductors 304 clear. This is a very important capability since it leaves the conductors 304 ready for building emitters on the substrate with minimal step coverage risk.

Another variation for glass frit planarization is a laser ablation technique wherein a high intensity CO2, argon, or excimer laser is employed to scan the surface of the conductors 304 prior to densifying and reflowing the frit. The frit can be removed selectively over the conductors 304 because organic material in the frit causes the frit to "pop-off" where it is reflected back in to the film (and where it is thinnest on top of the steps).

The laser ablation technique may even more effectively be utilized if the laser is selectively scanned to open only specific areas, thereby reducing process variation sensitivity at the expense of a more complex laser system.

Referring now to FIG. 3, an alternative device structure 320 has emitter conductors 322 recessed into trenches 324 in a substrate 326, which serves as a planarizing layer. Thus, the planarizing technique represented in FIG. 3 involves a change in device structure. The device structure 320 includes current limiter columns 328 and tip emitters 330, with gate electrodes 332 over insulating stacks 334.

The FIG. 3 device structure 320 features self-aligned trenches 324 filled with evaporated conductors 322 and then planarized using a resistive layer 334 with primarily vertically conducting materials (electron tunneling). This resistive layer material is ideally a material with electron tunneling characteristics, such as SiO doped with chromium (e.g., 5%–40%), and may be sputtered or evaporated from a mixed source. Diamond-like carbon undoped or doped with N, P, or B also may be used, as well as alternating layers of N and P type material. The SiO material is generally preferred and has a unique characteristic of high surface mobility and an ability to smooth the surface. CVD may also be used to deposit a resistor or current limiter material.

Spin-on current limiter materials also may be employed. An example material is tetraethylorthosilicate doped with ammonium chromate or boric acid.

This technique differs from other trench planarizations employed in the semiconductor industry in that the planarization material is a resistor or non-linear current limiter which becomes part of the device.

The emitter may be built on top of the surface of the current limiter or resistor after the planarization process is complete.

By way of example, a process for fabrication of a planarized current limiting field emitter array like that of FIG. 3 includes the following process steps:

1. Deposit optional underlayer (e.g. SiO, 2 mm).

2. Anneal substrate (e.g., 2 hours at 450° C. plus heat and cool cycles to prevent glass warpage).

3. Pattern the substrate for the trenches 324 and emitter conductors 322 using a liftoff profile resist (e.g., negative novolac photoresist).

4. RIE 400 nm using CF4+O2 to form trenches 324.

5. Deposit metal for the emitter conductors 322 using evaporation, e.g., either Al (400 nm) or sublayers of SiO2 (20 nm), Cr (20 nm), Cu (300 nm), Cr (40 nm).

6. Solvent strip resist and liftoff metal (e.g., NMP at 90° C., rinse in isopropyl alcohol (IPA), then water), leaving conductors 322 in trenches 324.

7. Ion beam clean, then deposit the non-linear current limiter layer 334 (e.g., SiO+Cr) by evaporation or sputtering (5–40% Cr by weight depending upon the emission current level required). CVD or spin on of other materials exhibiting preferential vertical conduction may also be used. An optional step prior to this deposition is spin on oxide (tetraethyl orthosilicate in IPA) to partially fill the gap between the conductor lines 322 and the insulator trench 324.

8. Deposit emitter 330 layer(s). Examples: silicon, gold and antimony doped silicon, SiO -50% Cr (20–80% Cr), SiO2+(20–30%) Cr, diamond-like carbon, or other conductor material with reasonably low electron-vacuum emission work function.

9. Pattern emitters 330, e.g., a thin chromium (100 nm) layer under photoresist.

10. Etch emitters 330 first isotropically (wet chemical or PIE) to preshape points, and then anisotropically to form base (RIE) for tall low capacitance gate-emitter lines.

11. Deposit the gate-emitter dielectric (e.g., SiO2) by directional evaporation or ion beam technique.

12. Photoresist pattern the gate lines for liftoff.

13. Evaporate the gate metal, for example Cr (50 nm), Nb (400 nm), Cr (100 mm), SiOx (200 nm). SiO used to protect devices from anode-gate flashover the oxygen content of SiOx should be controlled to permit slow etchability.

14. Liftoff gate metal in solvent (90° C. NMP) and rinse.

15. Optional follow-on processing may be used to coat the emitters or add other layers of field dielectric isolation.

Figure 5:
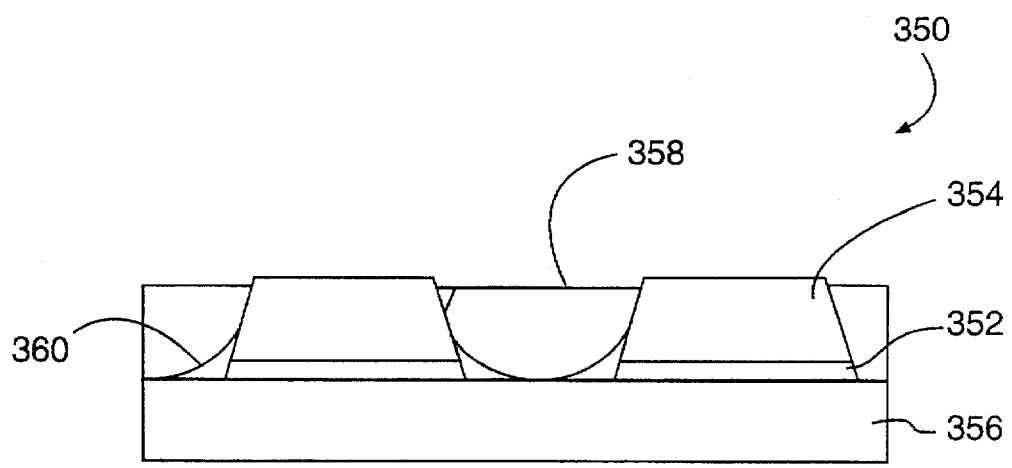

Illustrating another embodiment, FIG. 4 depicts a structure 350 prior to planarization, and FIG. 5 depicts the planarized structure 350'. In FIGS. 4 and 5, emitter conductors 352 and current limiters 354 are formed over a substrate 356. Shown as alternatives in FIG. 5 are a filled in insulator 358 and a stress-relief insulator fill-in 360.

The processes represented in FIGS. 4 and 5 more particularly is as follows:

1. Spin on ICI polysiloxane material - 2,000 Angstroms thickness

2. Bake at 450° C. for two hours in N2 with one hour temperature ramp up and down 3. PIE to clear tops CF4+O2 (form insulator cusps at edges of steps)

4. Deposit SiO2+SiO 50% (although other mixtures work), via sputter, CVD, or evaporation. >1.5 micron thick. (The use of SiO+SiO2 mixtures to tailor etch rate is preferred, but a wide range of 0 to 100% SiO in SiO2 is possible.)

5. Spin on planarization coating ~1.5 micron; the planarization coating may be a material such as BCB spin on coating material (Dow Chemical Company, Midland, Mich.), PC1 or PC2-1500 (Furorrex, Inc., Newton, N.J.), or a suitable polyimide material 6. Bake coating 200° C 30 minutes or on hot plate 7. RIE etch bake to clear tops CF4+O2

8. Deposit doped silicon, SiO+50% Cr, Nb or other emitter material, via sputter, CVD, or evaporation techniques.

Figure 6:
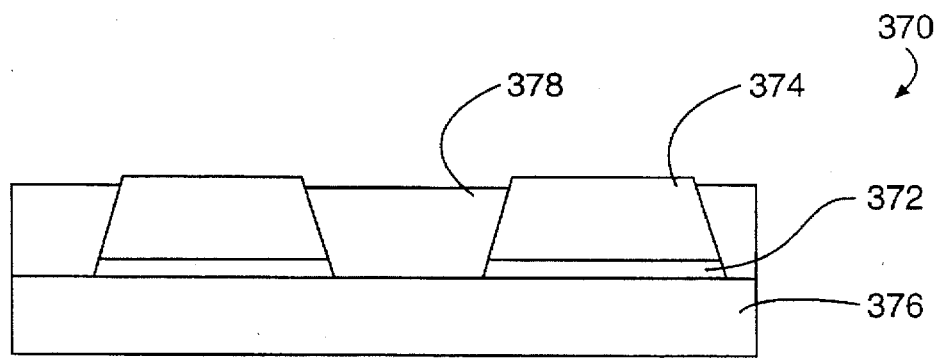
FIG. 6 depicts another fill-in planarization process and structure.

Yet another fill-in planarization process and structure 370 is depicted in FIG. 6. As above, emitter conductors 372 and current limiters 374 are formed over a substrate 376. Filled-in insulator is designated 378.

The process represented in FIG. 6 more particularly is as follows:

1. Deposit SiO2+SiO 50% - 1.8 micron

2. Spin on PCI

3. Bake PCI

4. RIE to clear tops and remove PCI (oxygen ash at end of process one minute). (The planarization etch may remove part of the current limiter 374 with minimal current limiter uniformity loss, but this can be eliminated by depositing an etch stop with an identifiable gas chromatograph emission signature in the plasma such as germanium (100 nm) over gold (50 nm) which can also act as a hole injector into the current limiter).

5. Deposit doped silicon (Nb, Au, Ag) at a thickness of for example of about 9,000 A.

Figure 7:
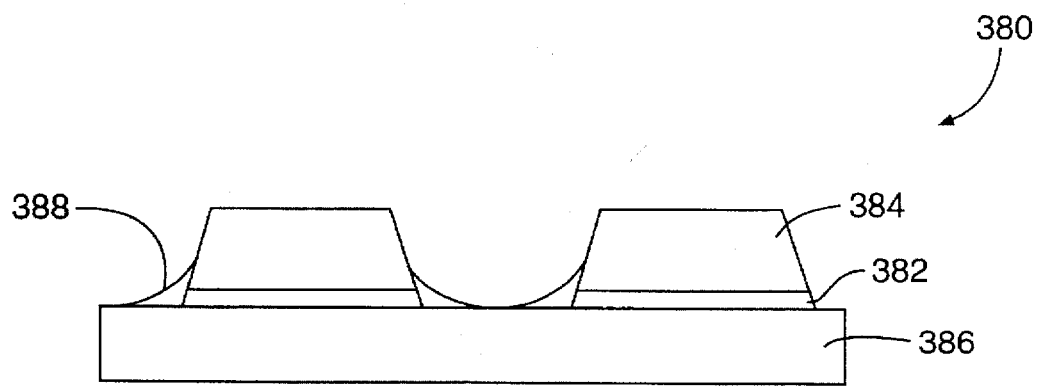
FIG. 7 depicts yet another fill-in planarization process and structure.

Another related fill-in planarization process and structure 380 is depicted in FIG. 7. As above, emitter conductors 382 and current limiters 384 are formed over a substrate 386. Stress relief insulator fill-in/planarization is designated 388.

The process represented in FIG. 7 more particularly is as follows:

1. Spin on polysiloxane, silicate, or other inorganic planarization material 2,000 A 2. Bake at 200° C. for 30 minutes 3. Spin on ICI 2,000 A 4. Bake at 450° C. for two hours in N2 with one hour temperature ramp up and down 5. RIE etch bake in clear tops CF4+O2. (The planarization etch may remove part of the current limiter with minimal current limiter uniformity loss, but this can be eliminated by depositing an etch stop with an identifiable gas chromatograph emission signature in the plasma such a germanium +10% gold (100 nm) over gold (50 nm) which can also act as a hole injector into the current limiter).

Figure 8:
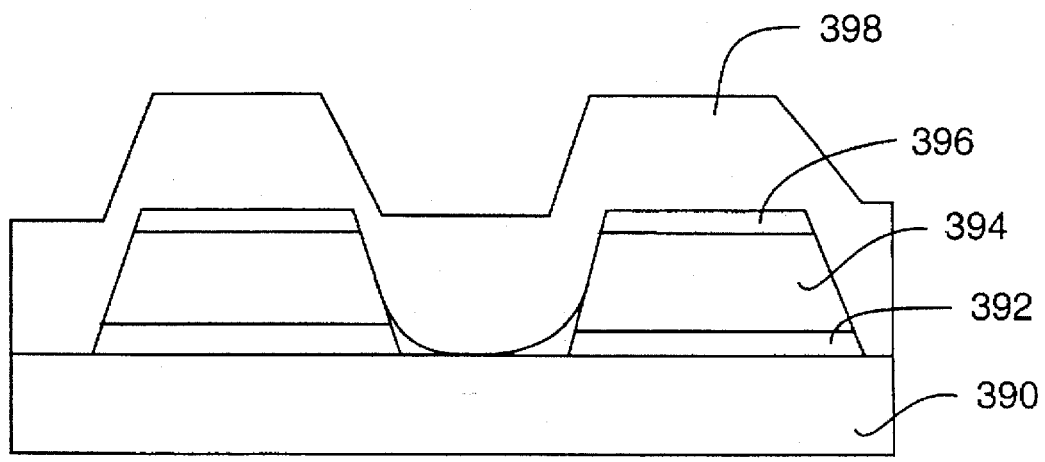
FIGS. 8 and 9 depict a pop-top planarization technique.
Figure 9:
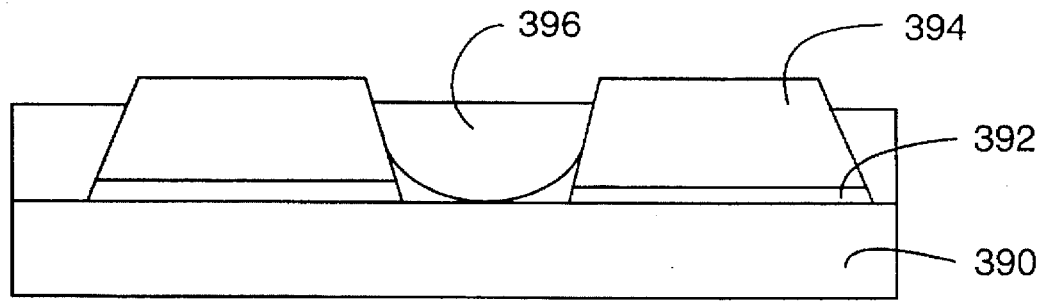

Another aspect of the invention is a pop-top planarization technique for fabrication of a field emitter array (FEA) With reference to FIGS. 8 and 9, the steps are as follows:

1. On a substrate 390, build an emitter conductor 392 and current limiter structure 394 using liftoff lithographic processing. Prior to solvent liftoff of the photoresist, deposit a "pop-top" layer 396 such as copper (or a layer of copper over a layer such as titanium or chromium to improve adhesion during pre "pop-off" processing). Then deposit a non-conformal insulator layer 398 such as evaporated or sputtered SiO2, resulting in the structure of FIG. 8.

2. Etch back the insulator layer 398 to expose the "pop-top" layer 396 by RIE (e.g., CF4+O2) or buffered oxide etch (BOE-ammonium bifluoride+HF+water, ~5% HF, e.g., ~60% ammonium fluoride).

3. Etch off the "pop-top" layer 396 to expose the top surface, resulting in the structure of FIG. 9.

4. If a layer was added as part of the adhesion sandwich it may be removed. This particular layer may also remain and act as the hole injector for the current limiter (e.g., a Ti - 10% Au alloy, Au, or boron-doped silicon). This layer may be patterned to self align with the emitter tips by etching into the layer after the emitter tip etch process.

Figure 10:
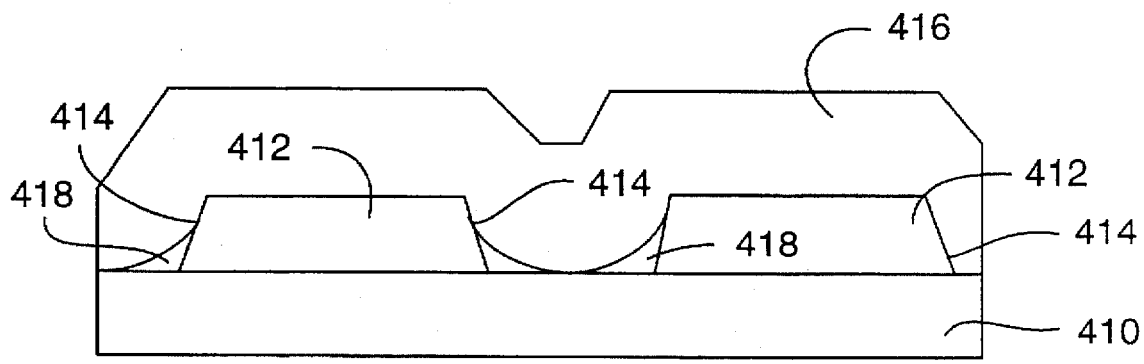
FIGS. 10 and 11 depict a planarization technique which minimizes the required step height.
Figure 11:
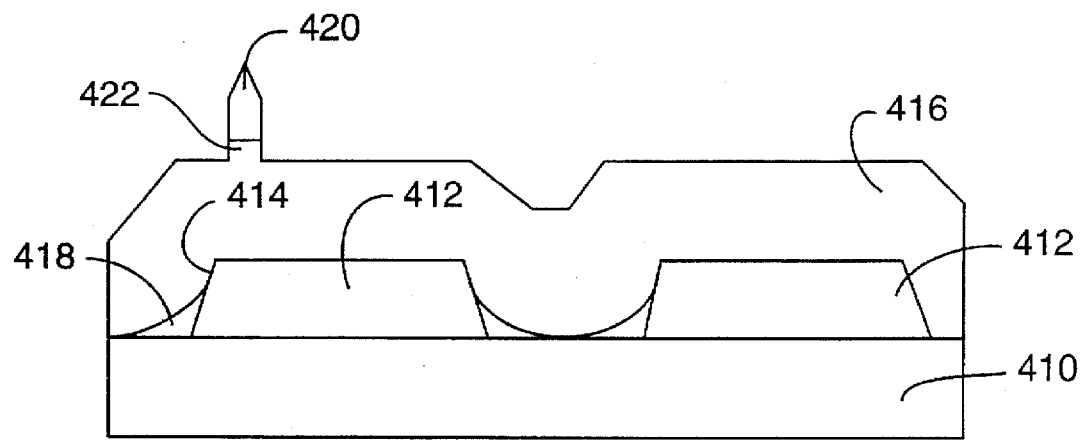

With reference to FIGS. 10 and 11, another embodiment of the invention is a planarization version which minimizes the required step height. Thus, if the design of a particular display is such that the vertical current conduction through the current limiter is very large relative to the lateral current conduction between leads, then the planarization process may be modified to an alternative simple form.

In particular, formed on a substrate 410 are emitter conductors 412, for example of Al+4% Cu; 20 nm Cr, 300 nm Cu, 60 nm Cr, 10 nm Al. The edges 414 of the conductors 412 are sloped by controlled etching (e.g., undercut etching of Al+4% Cu by phosphoric-nitric-acetic aluminum etchant) or by commercially available spin-on oxide deposition and RIE etch back (or both). A current limiter 416 (e.g., SiO+25% Cr, 2000 Angstroms) is sputtered or evaporated on top of the conductors 412.

Since the distance between conductors 412 is large relative to the current limiter 416 film thickness for most video display applications (e.g.,>20:1), the current limiter 416 material acts as a resistor without appreciable electric field assisted conductance enhancement. This internal resistance is large due to the high bulk resistance nature of the current limiter films desired for most display related field emitter applications (typically over 100 KW-cm). This small leakage current penalty is acceptable for many video display applications because of the fewer and simpler processing requirements.

An optional fillet insulator 418 of spin-on oxide may be formed to effect partial planarization and stress relief. The fillet 418 is not required in the event the conductor 412 edges 414 slope sufficiently for acceptable step coverage.

With reference to FIG. 11, a technique for further reducing lateral conductivity is illustrated. In particular, after an emitter tip 420 is formed, the current limiter material 416 is partially etched, leaving a portion 422 under the emitter tip.

Figure 12:
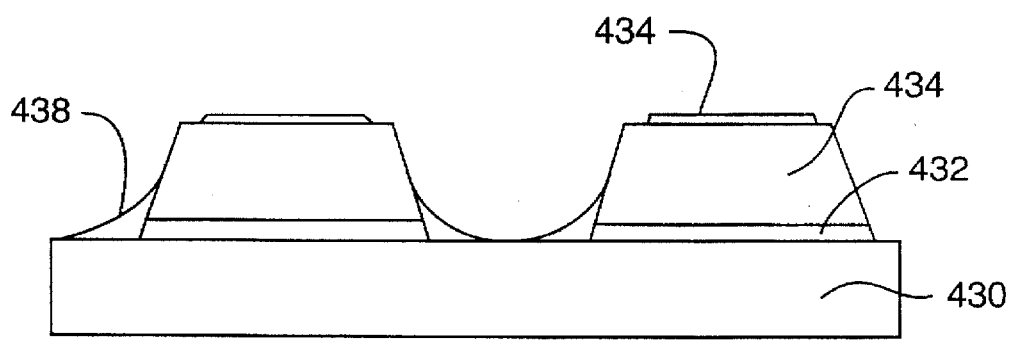
FIGS. 12 and 13 depicts the use of a conductive additive to an organic or inorganic spin-on oxide.
Figure 13:
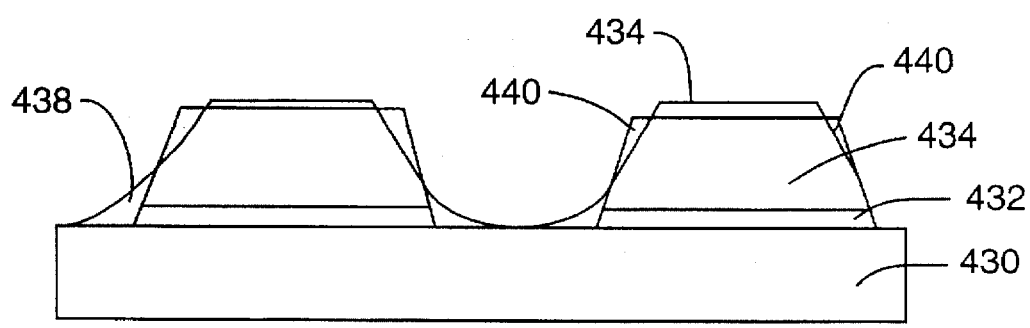

With reference to FIG. 12 and 13, another version of the planarization process is the addition of a conductive additive to an organic or inorganic spin-on oxide to produce a resistive layer having a bulk resistance comparable to that of the current limiter when conducting. This permits a less accurate, lower cost etch back process to be implemented since a small amount of residual spin-on material will have minimal impact on the device characteristics.

More particularly, in FIG. 12 formed on a substrate 430 are emitter conductors 432 and current limiters 434, with residual spin on oxide planarizing material 436 over the current limiters 434. Insulator fillets 438 provide partial planarization for stress relief.

Further, as shown in FIG. 13, during the etch back using a spin-on planarizing material, the corners of the current limiter material 434 may be etched off in-situ as depicted at 440 to aid in the planarization of the device.

Figure 14:
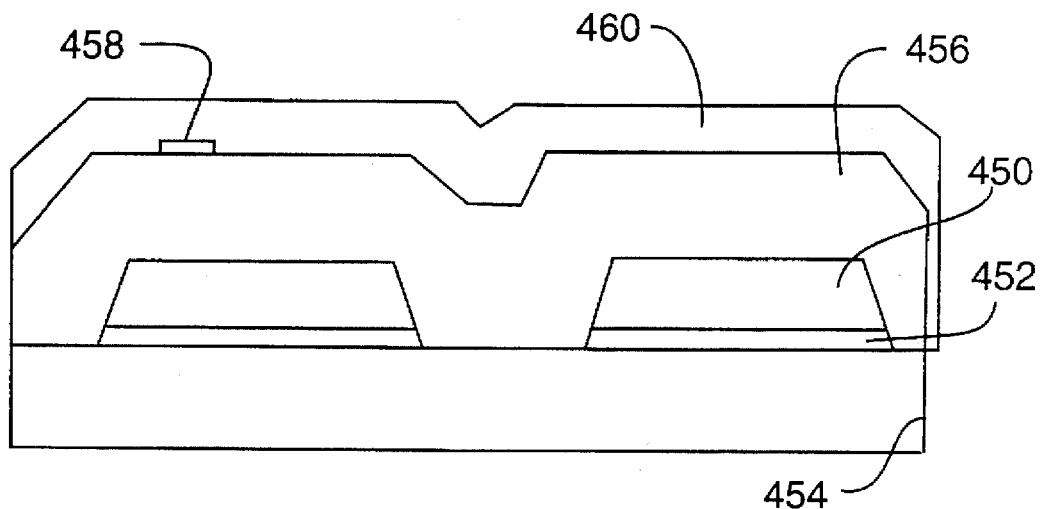
FIGS. 14 and 15 depict a process wherein spin-on planarization material is deposited after formation of etch block caps.
Figure 15:
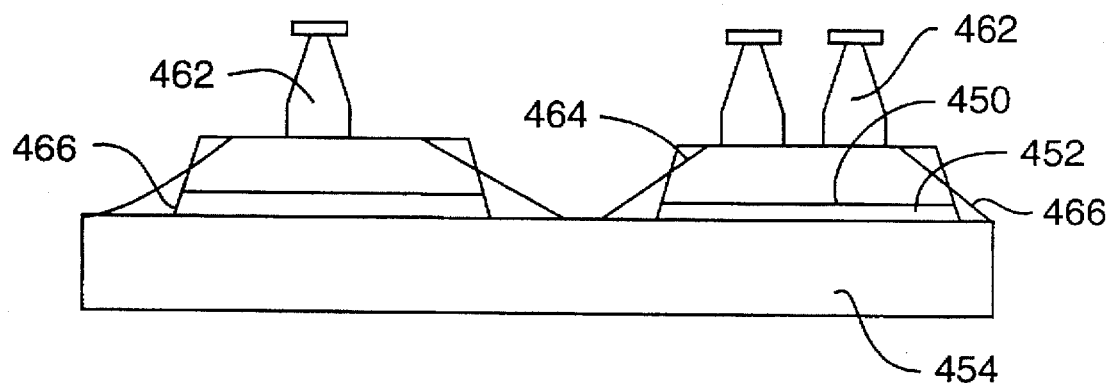

With reference to FIGS. 14 and 15, the emitter process sequence may be modified for an additional planarizing process whereby the spin-on material is deposited "after" formation of the caps. Thus in FIG. 14 current limiters 450 and emitter conductors 452 are formed on a substrate 454. A layer 456 of emitter material (e.g., Si+Nb+Au+SG) is applied, followed by a patterned inorganic cap 458 for etch block to subsequently define the actual emitter locations. Spin-on planarization material 460 (e.g., SOG, commercially available from AlliedSignal, Inc., Morristown, N.J.) is then applied, completing the FIG. 14 structure prior to etch back.

Then, an RIE etch process (CF4+O2) similar to that used for etching the emitters is then used for both the planarization and the emitter etch. FIG. 15 shows the structure after etchback. In FIG. 15, remaining portions 462 of the FIG. 14 emitter material layer 456 comprise the emitter columns. As in the embodiment of FIG. 13, corners of the current limiter material 450 may be etched off in-situ as depicted at 464 to aid in planarization. Also in FIG. 15, residual emitter material 456 may remain form the etch back step at 466.

The process of FIGS. 14 and 15 advantageously results in a short process flow, but requires good control of the etch parameters.

As another aspect of the invention, planarization techniques are provided which permit a smoothed surface to be used for the emitter patterning step; and wherein the resultant structure uses spin-on planarized silicon dioxide as part of an insulator structure.

Figure 16:
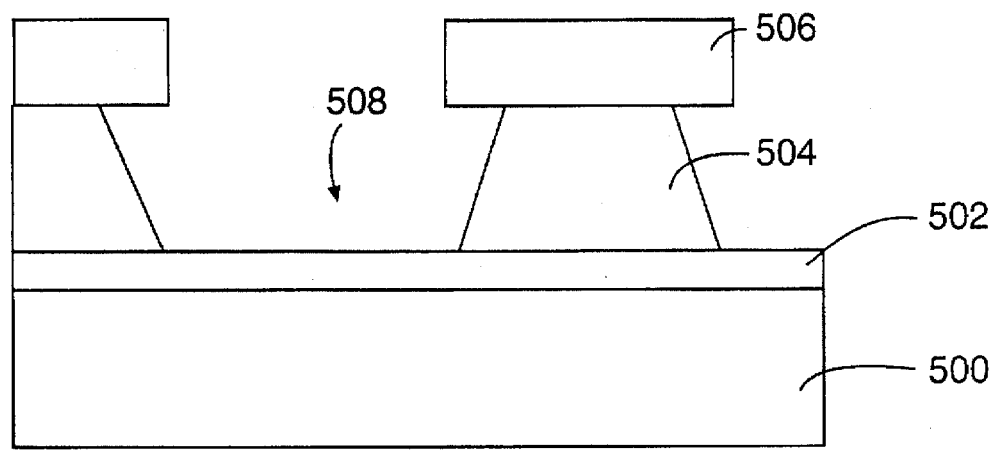
FIGS. 16, 17 and 18 depict initial steps in a process for planarization whereby a smoothed surface is used for an emitter patterning step.
Figure 17:
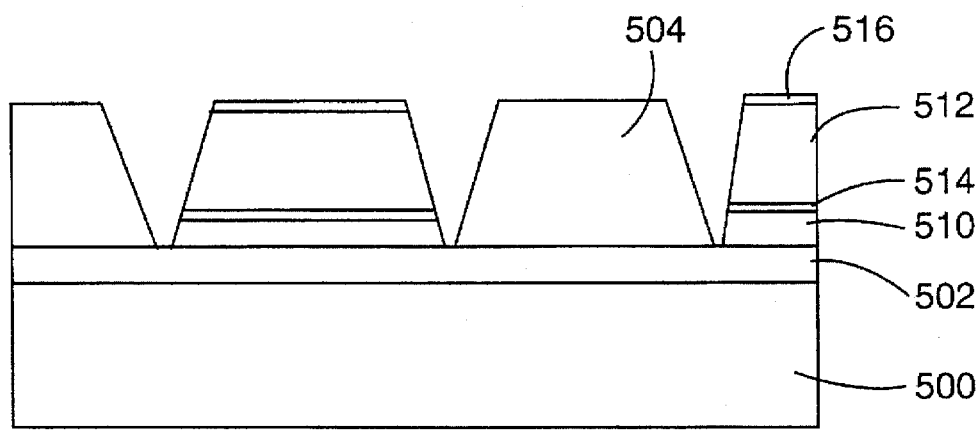
Figure 18:
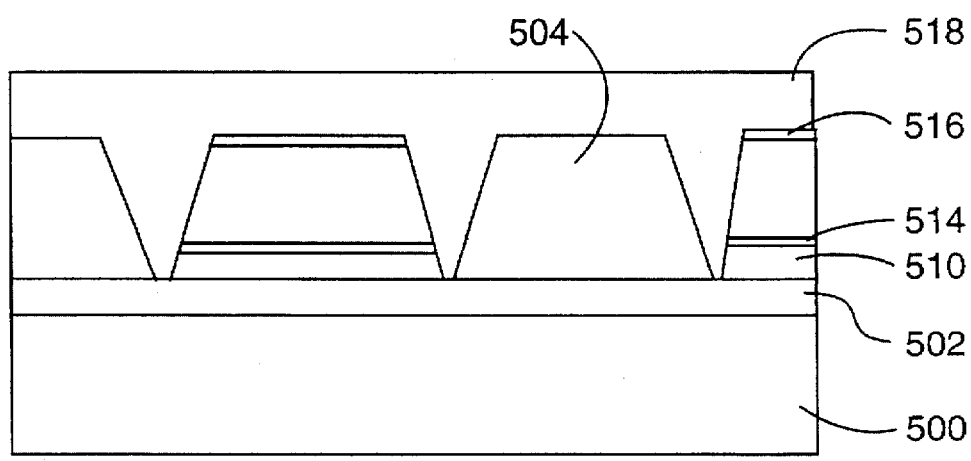

With reference to FIGS. 16, 17 and 18, an exemplary process is as follows:

1. Over a glass substrate 500 deposit etch stop layer 502 (e.g., SiO or Al2O3) for example 0.1 to 2 micron thickness, then deposit SiO2 layer 504 over the etch stop layer 502 to approximately the combined thicknesses of the planned emitter conductor and current limiter layers (e.g., 1 micron).

2. Pattern with photoresist 506 and etch trenches 508 through the SiO2 layer 504 down to the SiO etch stop layer 502 (RIE, plasma, or buffered oxide etch or a combination of these etches). Overetch sufficiently to remove SiO2 at the base so as to accurately set height. The etch stop 502 thus advantageously is employed to accurately set trench depth when a wet etch is used to finish the trench 508. The structure of FIG. 16 results.

3. Deposit emitter conductor 510 and then current limiter 512 by sputtering or evaporation, including bottom 514 or top 516 layers of, for example, 200 Å thickness of injector materials such as aluminum or gold depending upon the desired characteristics. An Au—(SiO+Cr)—Au film is shown in FIG. 17 for a peak current vs voltage device. The top layer 516 may be a combination of etch stop and/or carrier injector layers. The current limiter layer 512 may be masked off the ends of the emitter conductor 510 to facilitate future connection of the display to electronics.

4. Remove resist with solvent and liftoff deposited layers, resulting in the structure of FIG. 17.

5. As shown in FIG. 18, spin-on planarizing oxide 518 (e.g., Allied SOG) 0.5 to 2 microns thick, and bake 1 hour at 450° C. after slow temperature ramp (3 degrees per minute) to cure. The spin on material 518 may be deposited in multiple coats with intermediate baking steps.

Figure 19:
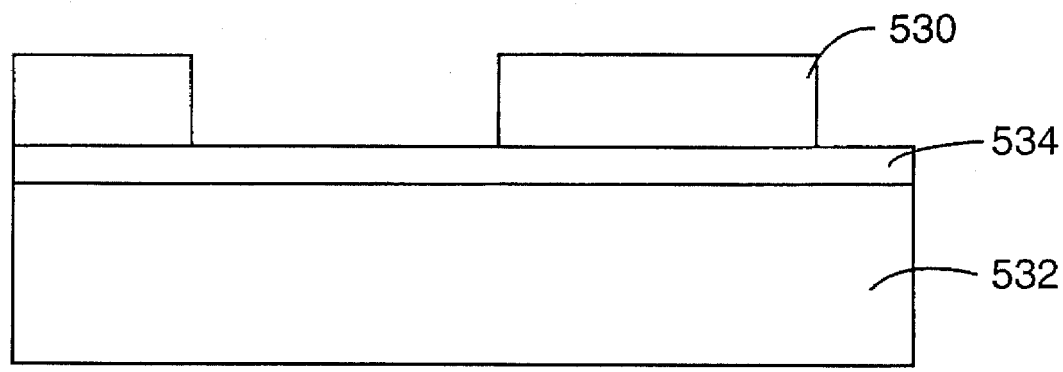
FIGS. 19, 20 and 21 depict alternative initial steps in a process for planarization whereby a smoothed surface is used for an emitter patterning step.
Figure 20:
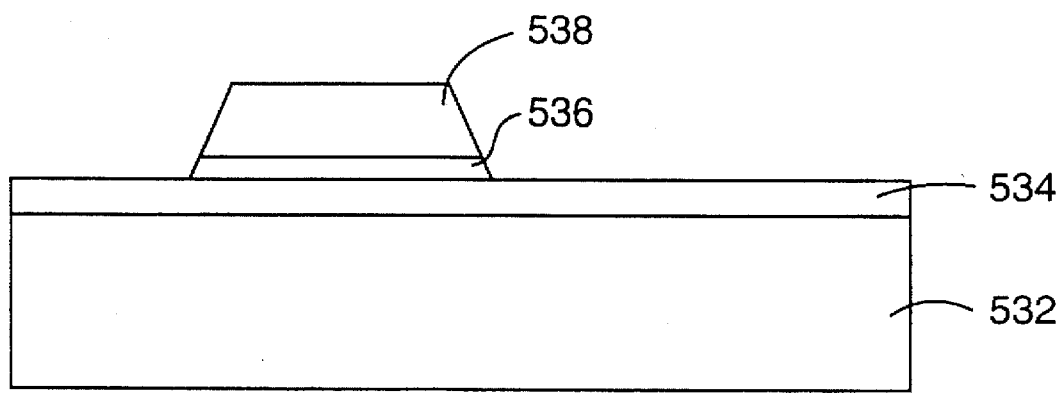
Figure 21:
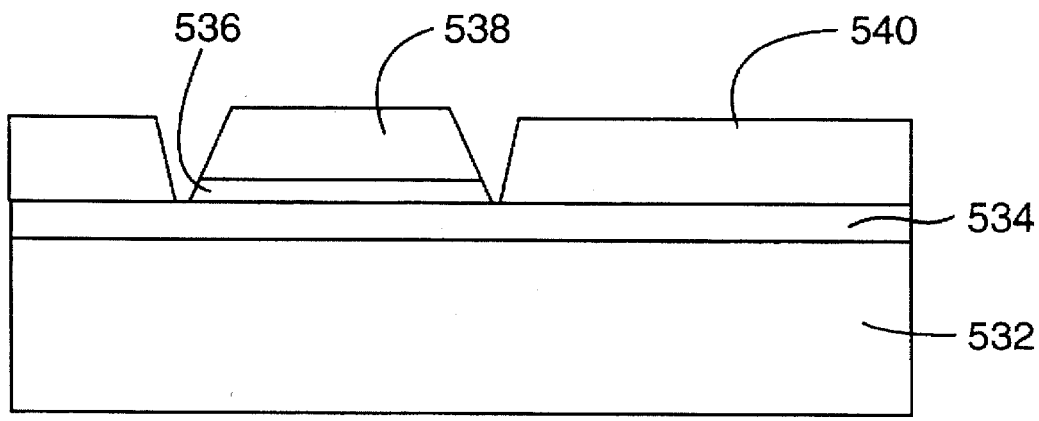

An alternative to the process of FIGS. 16-18 which results in nearly the same structure is represented in FIGS. 19-21.

1. An initial step, shown in FIG. 19, is coating and pattering resist 530 on a clean glass substrate 532 with an optional pure coating 534 of silicon dioxide or SiO.

2. Next, as shown in FIG. 20, deposit emitter conductor metal 536 and current limiter 538 with optional injector layers (e.g., SiO+20% Cr.) Then liftoff the FIG. 19 resist 530 (in solvent such as NMP with an IPA rinse) along with the excess metal.

3. Coat with ~2 micron positive resist, bake, expose the resist from the backside using a light source (e.g., Hg lamp), with the rows or columns of the device as a mask for light passing through the transparent or translucent substrate, develop in suitable basic developer and bake (120 degrees C, 30 min).

4. As shown in FIG. 21, deposit insulator 540 onto the front side of the plate (e.g., SiO2) at the same thickness as the combined current limiter and emitter metal thickness, and then liftoff the resist with the excess insulator in solvent such as NMP with an IPA rinse.

5. Spin-on-oxide and bake as described above with reference to FIG. 18 to achieve a similar structure.

Continuing on from the structure of FIG. 18, whether achieved by the process of FIGS. 16-18, or by the process of FIGS. 19-22, various process options may be performed. An etched emitter tip process is described hereinbelow with reference to FIGS. 22-24, and an evaporated type emitter process is described hereinbelow with reference to FIGS. 25-27.

Figure 22:
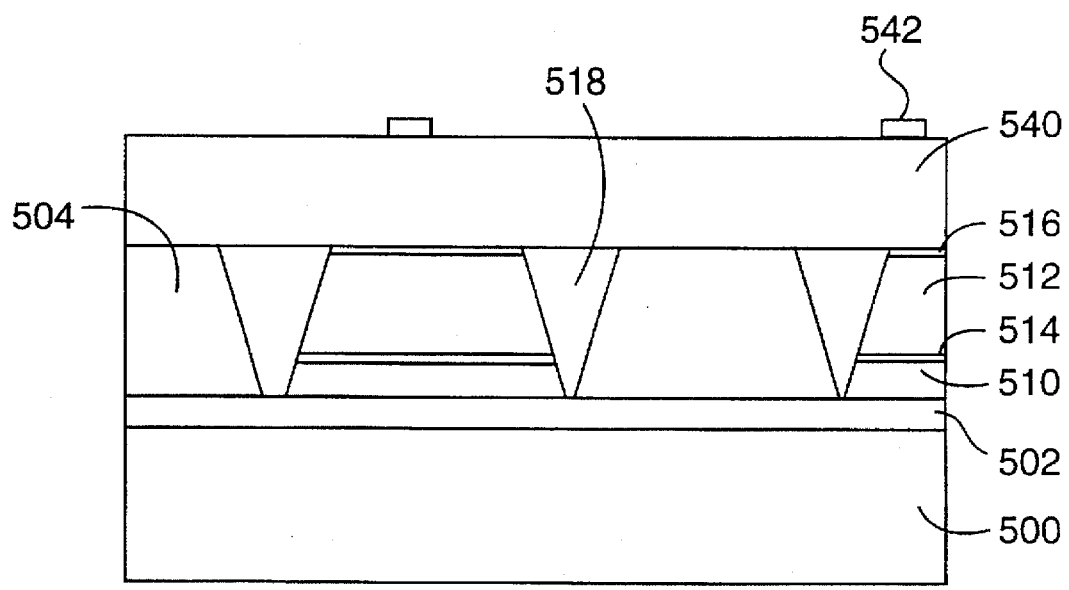
FIGS. 22, 23 and 24 show an etched emitter tip process which may be employed after either the initial steps of the process of FIGS. 16–18 or the initial steps of the process of FIGS. 19–21.
Figure 23:
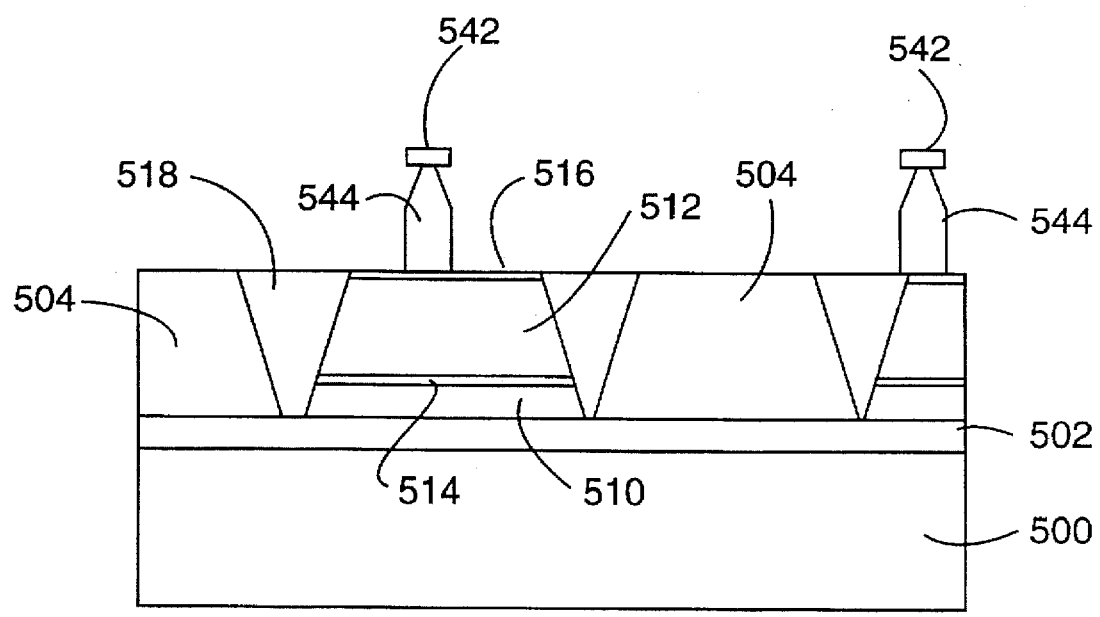
Figure 24:
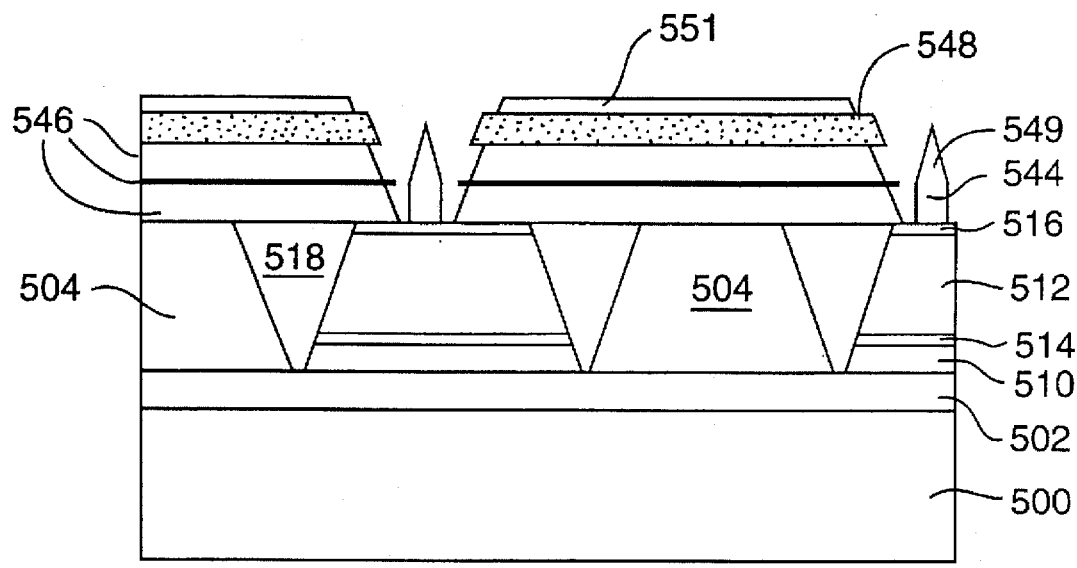

Considering the etched emitter tip process of FIGS. 22-24 in detail, the steps are as follows:

1. Etch back or polish the FIG. 18 spin on oxide 518 to expose the top of the current limiter material 512 or the surface of the injector layer 516.

2. Optionally deposit injector layer 516 if not done in a preceding step unless the emitter material adequately serves this purpose (e.g., silicon with gold doping serves this purpose). Then, deposit the emitter material 540 such as silicon or molybdenum.

3. Liftoff pattern and deposit etch resistant caps 542 (e.g., 50 nm to 2,000 nm).

4. Etch the emitter material 542 first isotropically then anisotropically to form emitters 544 as shown in FIG. 23.

5. As shown in FIG. 24, deposit the gate insulator layers 546 (e.g., SiO and SiO2) and then pattern the gate lines for deposition of conductor and liftoff or etch of the gate conductor 548. An optional additional insulator layer 551 may be utilized to enhance the electrical isolation of the gate coductor in the final product article. Etch the emitter material to sharpen the points 549 and liftoff the caps to complete the emitter array.

Figure 25:
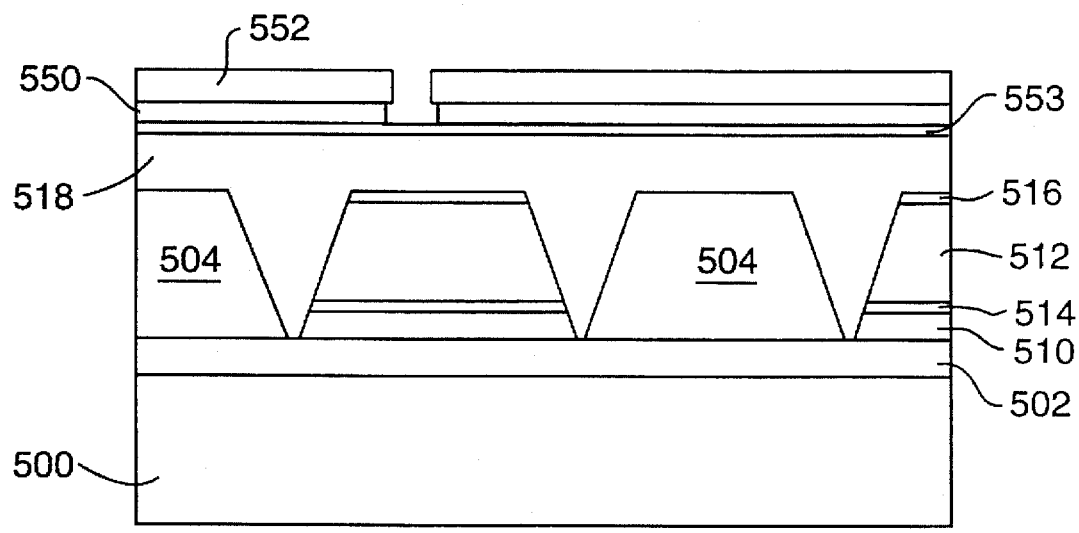
FIGS. 25–27 depict an evaporated type emitter process which may be employed after either the initial steps of the process of FIGS. 16–18, or the initial steps of the process of FIGS. 19–21.
Figure 26:
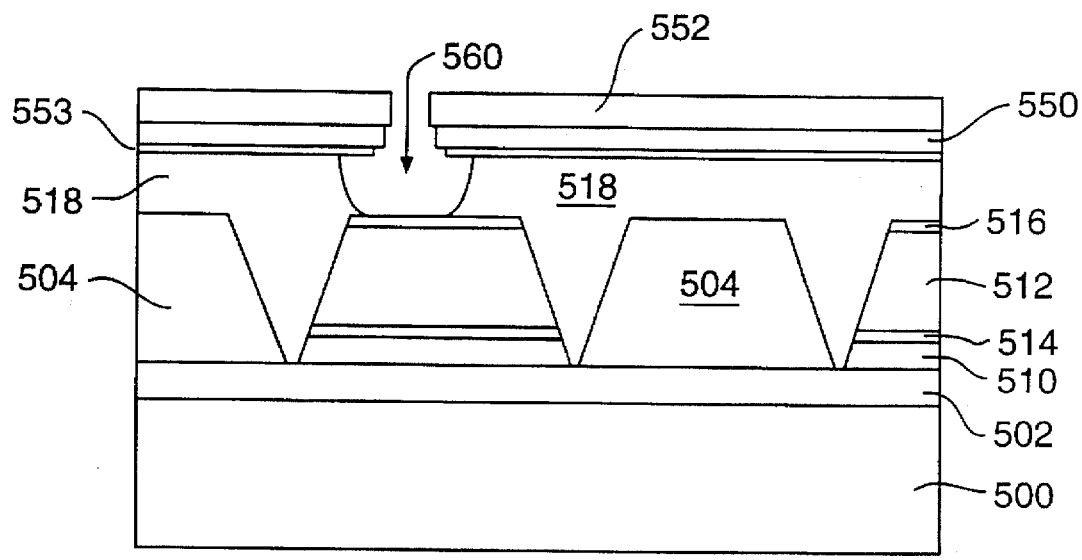
Figure 27:
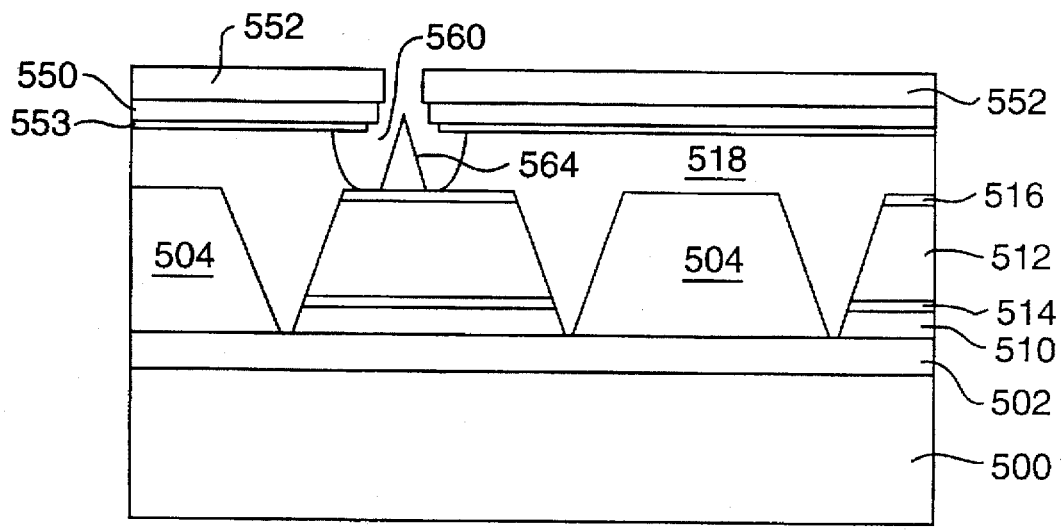

The evaporated type emitter process of FIGS. 25-27 is as follows: pattern the top surface of the dielectric 518 with a photoresist pattern, then deposit a conductor layer 550 (e.g., chromium) and a liftoff layer 552 (e.g., copper) by sputtering or evaporation. An optional second layer 553 of dielectric such as SiO, SiO2, or a mixture of such oxides may be employed. Use solvents to liftoff the dots of photoresist and metal on top the dots, leaving an array of holes in the metal and liftoff layer film. Deposition, pattern, and etch process sequences can create similar structures, but are not shown in this example. Groups of pixels may be patterned using conventional lithography with steppers, scanners, or holography.

The patterns may be exposed in the photoresist using interfered laser beams since the substrate is free of surface roughness. The exposure may be performed by exposing a line and space interference pattern from a krypton (wavelength=~416 nm) or argon laser (wavelength=~351 nm), rotating the substrate 90 degrees, and then exposing again. A laser interference feedback development system is required. An antireflective layer such as polyimide is recommended. Self-alignment of pixels can be used where emitter leads and gates overlap even if a coverall dot array pattern is used. The resist may thus be employed over an antireflective layer, and with the resist being used to block deposition of emitter material from the gate edge during fabrication.

A lithographic mask pattern in addition to the emitter dots may be used to shape arrays of dots into groups. This mask also be used to create large dot or line patterns which do not close up during the later emitter depositions, thereby enhancing the speed of emitter liftoff.

An optional second layer of dielectric may be deposited after curing of the spin-on dielectric (second layer of dielectric can be SiO, $SiO_2$, SiO+SiO2 mixture, or other materials).

With reference to FIG. 26, etch holes 560 in the dielectric 518 using RIE (e.g., CF4), wet processing such as BOE, or a combination thereof. A wet etch is optimally used to finish the etch to ensure a clean etch stop on the current limiter material/injector layer. Etch back the conductor to recess the edge of the gate away from the deposition path of the subsequent emitter material deposition.

With reference to FIG. 27, deposit the emitter 564 material down into the holes 560 (e.g., silicon, SiO+50% Cr by evaporation) at low pressure (<10-5 torr) until the holes close off, thereby forming a point in a manner known in the art (e.g., see Spindt et al. U.S. Pat. No. 3,665,241). The liftoff layer may now be removed (nitric acid may be used to release the excess emitter material if a copper liftoff layer is used).

An emitter coating may now be applied to reduce the work function if a high work function material was used as the emitter (e.g., SiO+Cr, a diamond like film). A sidewall cleanup is generally required after such a deposition to reduce gate to emitter electrical leakage.

The emitter lines are then lithographically patterned and etched (e.g., using potassium permanganate solution to etch chromium following an etch of any low work function coating layer). Other etchants are usefully employed for other conductor metals, as known in the art.

While specific embodiments of the invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A method for manufacture of a microelectronic field emitter device, comprising:

applying a patterned layer of liftoff profile resist over a substrate to define emitter conductor locations;

employing the patterned resist layer to form trenches in the substrate at the emitter conductor locations;

depositing metal for emitter conductors within the trenches and over the patterned resist layer;

removing the patterned resist layer and lifting off metal over the resist layer, while leaving conductors in the trenches;

depositing a current limiter layer over the conductors and areas of the substrate between trenches;

depositing a layer of emitter material;

pattern masking and etching the layer of emitter material to form emitter structures;

depositing gate dielectric;

applying a patterned layer of liftoff profile resist over the gate dielectric;

evaporating gate metal; and removing the patterned resist layer and lifting off metal over the resist layer to define gate electrodes.

2. A method for manufacture of a microelectronic field emitter device, comprising:

applying a patterned layer of liftoff profile resist over a substrate to define an emitter conductor material and a current limiter material;

depositing a pop-top metal layer over the current limiter material;

removing the liftoff profile resist and portions of the emitter conductor material, current limiter material and pop-top metal layer thereover to define current limiter structure over emitter conductors, with pop-top metal on top;

depositing a layer of insulator material;

etching back the insulator material layer to expose the top surface of the pop-top metal layer;

etching to remove the pop-top metal layer, leaving current limiter structures substantially coplanar with a surrounding insulator material layer; and forming emitter structures on the current limiter structures.

3. A method according to claim 2, which further comprises partially etching the layer of current limiter material to leave current limiter material structures under the emitter structures.

4. A method for manufacture of a microelectronic field emitter device, comprising:

forming emitter conductor and current limiter structures on a substrate;

applying a layer of emitter material over the current limiter structures and substrate;

applying patterned caps for etch block on the layer of emitter material to define emitter locations;

applying a layer of planarization material; and reactive ion-etching to define emitter structures.

* * * * *